United States Patent
Zhou

(10) Patent No.: US 11,605,735 B2
(45) Date of Patent: Mar. 14, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/993,693

(22) Filed: Aug. 14, 2020

(65) Prior Publication Data

US 2021/0050440 A1    Feb. 18, 2021

(30) Foreign Application Priority Data

Aug. 15, 2019   (CN) .......................... 201910753684.5

(51) Int. Cl.
*H01L 29/66*     (2006.01)
*H01L 29/78*     (2006.01)
*H01L 29/739*    (2006.01)

(52) U.S. Cl.
CPC ...... *H01L 29/785* (2013.01); *H01L 29/66007* (2013.01); *H01L 29/7396* (2013.01); *H01L 29/7833* (2013.01)

(58) Field of Classification Search
CPC ............ H01L 29/0676; H01L 29/0649; H01L 29/785; H01L 29/7396; H01L 29/7833; H01L 29/66007; H01L 29/66795; H01L 29/66666; H01L 29/7827; H01L 29/41741; H01L 29/41791; H01L 29/45; H01L 29/42392; H01L 29/4933; H01L 29/665; H01L 29/66507; H01L 29/7845; H01L 21/28052; H01L 21/28061; H01L 21/28518; H01L 21/32051; H01L 21/32053; H01L 21/76889; H01L 21/76883; H01L 21/823418;
(Continued)

(56) References Cited

U.S. PATENT DOCUMENTS 7,193,270 B2 *   3/2007   Ohta .................. H01L 27/0688
                                              257/329
2010/0270611 A1 * 10/2010 Masuoka ............ H01L 29/0847
                                              257/329
(Continued)

*Primary Examiner* — Natalia A Gondarenko
(74) *Attorney, Agent, or Firm* — Anova Law Group, PLLC

(57) ABSTRACT

Semiconductor structure and a method for fabricating the semiconductor structure are provided. The semiconductor structure includes a substrate, a doped source layer formed in the substrate; a channel pillar formed on the doped source layer; a gate structure formed on the sidewall surface of the channel pillar; a first contact layer, having a first thickness and formed at the surface of the doped source layer; and a second contact layer having a second thickness and formed on the top surface of the channel pillar. The first thickness is greater than the second thickness.

13 Claims, 5 Drawing Sheets

(58) Field of Classification Search
CPC ..... H01L 21/823814; H01L 21/823821; H01L 21/823443; H01L 21/823835; H01L 23/485; H01L 2029/7858
USPC .................................. 257/401, 329, E29.262
See application file for complete search history.

(56) References Cited

U.S. PATENT DOCUMENTS

| | | | |
|---|---|---|---|
| 2015/0137067 A1* | 5/2015 | Colinge | H01L 29/775 257/9 |
| 2016/0308002 A1* | 10/2016 | Yang | H01L 29/0649 |
| 2018/0331101 A1* | 11/2018 | Anderson | H01L 21/823885 |
| 2019/0081180 A1* | 3/2019 | Park | H01L 29/78642 |
| 2020/0006552 A1* | 1/2020 | Anderson | H01L 21/823487 |

* cited by examiner

SEMICONDUCTOR STRUCTURE AND FABRICATION METHOD THEREOF

CROSS-REFERENCE TO RELATED APPLICATION

This application claims priority to Chinese Patent Application No. 201910753684.5, filed on Aug. 15, 2019, the entire content of which is incorporated herein by reference.

TECHNICAL FIELD

The present disclosure generally relates to the field of semiconductor manufacturing technology and, more particularly, to semiconductor structures and fabrication methods thereof.

BACKGROUND

Fin field-effect transistor (Fin FET), as a multi-gate device, often includes a fin structure protruding from the surface of a semiconductor substrate, a gate structure covering a portion of the top and sidewall surfaces of the fin structure, and doped source-drain regions formed in the fin structure on the two sides of the gate structure. Compared to a planar metal-oxide-semiconductor (MOS) FET, the Fin FET demonstrates more desired ability in suppressing the short-channel effect, and has a greater operating current.

With further development of the semiconductor technology, the size of integrated circuit (IC) devices becomes smaller and smaller, and more challenges are generated when further increasing the operating current of existing Fin FETs. Specifically, since only an area near the top and sidewall surfaces of the fin structure is used as the channel region, the volume of the fin structure that is used as the channel region may be small, which is conducive to increasing the operating current of the Fin FET. Therefore, a Fin FET with a gate-all-around (GAA) structure is provided to increase the volume of the channel region, and thus further increase the operating current of the Fin FET.

However, the device performance of the Fin FET with the GAA structure according to existing technology still needs to be improved. The disclosed semiconductor structures and fabrication methods thereof are directed to solve one or more problems set forth above and other problems in the art.

SUMMARY

One aspect of the present disclosure provides a semiconductor structure. The semiconductor structure includes a substrate; a doped source layer formed in the substrate; a channel pillar formed on the doped source layer; a gate structure formed on the sidewall surface of the channel pillar; a first contact layer, having a first thickness and formed at the surface of the doped source layer; and a second contact layer having a second thickness and formed on the top surface of the channel pillar. The first thickness is greater than the second thickness.

Optionally, the first thickness is in a range of approximately 5 nm to 10 nm.

Optionally, the second thickness is in a range of approximately 3 nm to 6 nm.

Optionally, the first contact layer is made of a metal silicide, the metal silicide including titanium silicide, nickel silicide, cobalt silicide, or a combination thereof; and the second contact layer is made of a metal silicide, the metal silicide including titanium silicide, nickel silicide, cobalt silicide, or a combination thereof.

Optionally, the semiconductor structure further includes a first conductive structure, formed on the first contact layer; and a second conductive structure, formed on the second contact layer.

Optionally, the first conductive structure is made of a metal, the metal including copper (Cu), tungsten (W), aluminum (Al), or a combination thereof; and the second conductive structure is made of a metal, the metal including copper (Cu), tungsten (W), aluminum (Al), or a combination thereof.

Optionally, the gate structure includes a first portion and a second portion. The first portion of the gate structure surrounds the channel pillar, and the second portion of the gate structure is formed over the substrate on one side of the channel pillar.

Optionally, the first portion of the gate structure includes: a gate dielectric layer formed on the sidewall surface of the channel pillar, a first portion of a work function layer formed on the gate dielectric layer, and a first portion of a gate electrode layer formed on the first portion of the work function layer; and the second portion of the gate structure includes: a second portion of the work function layer formed over the substrate; and a second portion of the gate electrode layer formed over the second portion of the work function layer.

Optionally, the gate dielectric layer is made of a material having a dielectric constant greater than 3.9; the work function layer is made of a material including titanium nitride ($TiN_x$), titanium aluminum alloy, or tantalum nitride ($TaN_x$) and the gate electrode layer is made of polycrystalline silicon or a metal, wherein the metal includes tungsten (W).

Optionally, the semiconductor structure further includes a third conductive structure, formed on the second portion of the gate structure.

Optionally, the semiconductor structure further includes a first isolation layer, disposed between the gate structure and the substrate; and a second isolation layer, formed on the first isolation layer. The gate structure is located in the second isolation layer.

Optionally, the semiconductor structure further includes a third isolation layer, formed on the gate structure and the second isolation layer.

Another aspect of the present disclosure provides a method for forming a semiconductor structure. The method includes providing a substrate; forming a doped source layer in the substrate; forming a channel pillar on the doped source layer; forming a gate structure on the sidewall surface of the channel pillar; forming a first contact layer at the doped source layer, the first contact layer having a first thickness; and forming a second contact layer on the top surface of the channel pillar, the second contact layer having a second thickness. The first thickness is greater than the second thickness.

Optionally, the method further includes: forming a first isolation layer on the doped source layer; forming a second isolation layer on the first isolation layer, wherein the second isolation layer covers the sidewall surface of the gate structure; and forming a third isolation layer on the gate structure and the second isolation layer.

Optionally, forming the first contact layer on the doped source layer incudes forming a first mask layer over the third isolation layer, the first mask layer exposing a portion of the third isolation layer; etching the third isolation layer, the second isolation layer, the first isolation layer, and the doped source layer using the first mask layer as an etch mask to form a first trench in the third isolation layer, the second isolation layer, the first isolation layer, and the doped source layer; forming a first contact material layer at a bottom of the first trench; and annealing the first contact material layer to form the first contact layer. The first contact material layer is formed by a physical vapor deposition (PVD) process, an electroplating process, an atomic layer deposition (ALD) process, or a combination thereof.

Optionally, the method further includes forming a first conductive structure on the first contact layer, including: forming a conductive structure material layer over the first contact layer and the third isolation layer; and planarizing the conductive material layer until exposing the third isolation layer to form the first conductive structure.

Optionally, forming the second contact layer on the top surface of the channel pillar incudes: forming a second mask layer on the third isolation layer, the second mask layer exposing a portion of the third isolation layer; etching the third isolation layer using the second mask layer as an etch mask until exposing the top surface of the channel pillar to form a second trench in the third isolation layer; forming a second contact material layer at a bottom of the second trench; and annealing the second contact material layer to form the second contact layer. The second contact material layer is formed by a physical vapor deposition (PVD) process, an electroplating process, an atomic layer deposition (ALD) process, or a combination thereof.

Optionally, forming the gate structure on the sidewall surface of the channel pillar includes: forming a gate dielectric layer on the sidewall surface of the channel pillar; forming a work function layer on the gate dielectric layer and over the substrate on one side of the channel pillar; and forming a gate electrode layer on the work function layer.

Optionally, after forming the second isolation layer, the method further includes etching back the second isolation layer and a portion of the gate electrode layer and the work function layer formed on the top surface of the channel pillar until exposing the gate dielectric layer on the top surface of the channel pillar and the sidewall surface of the channel pillar.

Optionally, the method further includes forming a second conductive structure on the second contact layer, including: forming a conductive structure material layer over the second contact layer and the third isolation layer; and planarizing the conductive structure material layer until exposing the third isolation layer to form the second conductive structure.

Compared to existing semiconductor structures and fabrication methods, the disclosed semiconductor structures and fabrication methods may demonstrate the following exemplary advantages.

According to the disclosed semiconductor structures, the first contact layer has a first thickness, the second contact layer has a second thickness, and the first thickness is greater than the second thickness. When the thickness of the first contact layer is large, the contact resistance at the first contact layer may be small. Therefore, the current flowing through the circuit may be large, which is conducive to improving the device performance of the semiconductor structure. When the thickness of the second contact layer is small, at the position where the subsequently formed conductive structure contacts the second contact layer, the current leakage caused by the metal ions in the second contact layer diffusing into the channel pillar is reduced. Therefore, the device performance of the semiconductor structure may be improved.

According to the disclosed fabrication methods, the first contact layer formed at the surface of the doped source layer has a first thickness, and the second contact layer formed on the top surface of the channel pillar has a second thickness. The process of forming the first contact layer is different from the process of forming the second contact layer, such that the first contact layer and the second contact layer may have different thicknesses. As such, the requirement that the contact layer has different thicknesses at different positions may be satisfied, and thus the device performance of the semiconductor structure may be improved.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

According to the existing technology, the device performance of Fin FET with a gate-all-around (GAA) structure may still need to be improved. In the following, further analysis and description will be made in combination with an example.

Figure 1:
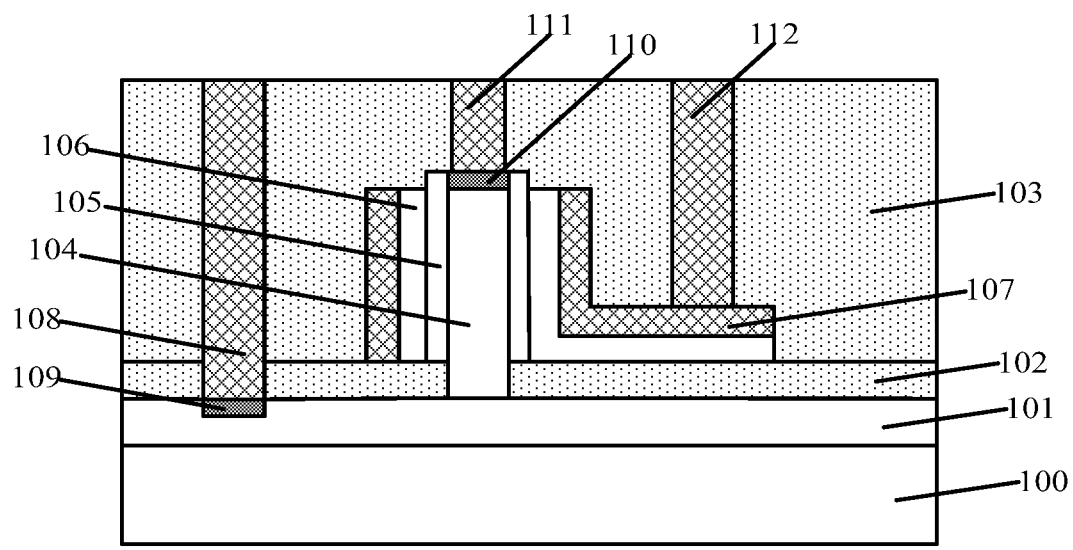
FIG. 1 illustrates a schematic cross-sectional view of a semiconductor structure.

FIG. 1 illustrates a schematic cross-sectional view of a semiconductor structure. Referring to FIG. 1, the semiconductor structure includes a substrate 100; a doped source layer 101 formed in the substrate 100; a channel pillar 104 disposed on the doped source layer 101; and an isolation layer 102 formed on the doped source layer 101. The isolation layer 102 covers a portion of the sidewall surface of the channel pillar 104. The semiconductor structure further includes a gate structure (not labeled) formed on the sidewall surface of the channel pillar 104. The gate structure surrounds the channel pillar 104 and includes a gate dielectric layer 105 formed on the sidewall surface of the channel pillar 104, a work function layer 106 formed on the gate dielectric layer 105, and a gate electrode layer 107 formed on the work function layer 106. A portion of the work function layer 106 and a portion of the gate electrode layer 107 extend to laterally cover a portion of the top surface of the isolation layer 102. The semiconductor structure includes a dielectric layer 103 formed on the isolation layer 102. With a top surface higher than the top surface of the gate structure, the dielectric layer 103 covers the top and the sidewall surfaces of the gate structure. That is, the gate structure is located in the dielectric layer 103. The semiconductor structure includes a source conductive structure (not labeled) formed on the surface of the doped source layer 101 and penetrating through the isolation layer 102 and the dielectric layer 103. The source conductive structure includes a source contact layer 109 formed in the doped source layer 101, and a source plug 108 formed on the source contact layer 109. The semiconductor structure also includes a drain conductive structure (not labeled) formed above the channel pillar 102 and penetrating through the dielectric layer 103. The drain conductive structure includes a drain contact layer 110 and a drain plug 111 formed on the drain contact layer 110. Further, the semiconductor structure includes a gate conductive plug 112 formed on the gate electrode layer 107 and penetrating through the dielectric layer 103.

In the semiconductor structure, the source contact layer 109 in the source conductive structure and the drain contact layer 110 of the drain conductive structure are formed using a same process, and thus have a same thickness. However, the performance requirements for the source conductive structure and the drain conductive structure are different. For example, the contact resistance at the source contact layer 109 in the source conductive structure needs to be small to allow a large current through the source conductive structure. Therefore, a larger thickness is required for the source contact layer 109. The drain conductive structure is formed above the channel pillar 102, and when the thickness of the drain contact layer 110 is too thick, ions in the drain contact layer 110 may be able to easily diffuse into the channel pillar 102, which may easily cause current leakage at the position where the drain conductive structure contacts the channel pillar 102, thereby affecting the device performance of the semiconductor structure.

To solve the problem described above, the present disclosure provides a semiconductor structure and a method for forming the semiconductor structure. According to the disclosed semiconductor structure and fabrication method, the source contact layer and the drain contact layer have different thicknesses. For example, the thickness of the source contact layer is relatively large, such that the contact resistance between the source conductive structure and the doped source layer is small, and thus the current flowing through the source conductive structure can be large. When the thickness of the drain contact layer is small, diffusion of the metal ions in the drain contact layer into the channel pillar is reduced, such that current leakage at the position where the drain conductive structure contacts the channel pillar is reduced, thereby improving the device performance of the semiconductor structure.

To make the aforementioned objectives, features, and beneficial effects of the present disclosure more comprehensible, specific embodiments of the present disclosure are described in detail with reference to the accompanying drawings.

Figure 7:
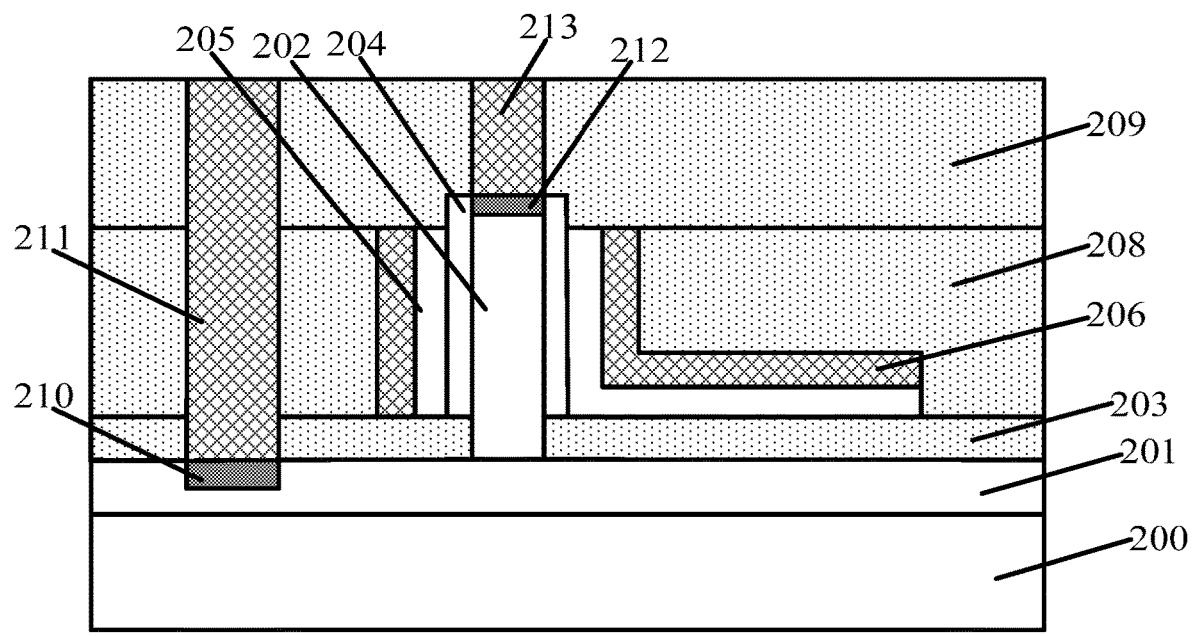
Figure 8:
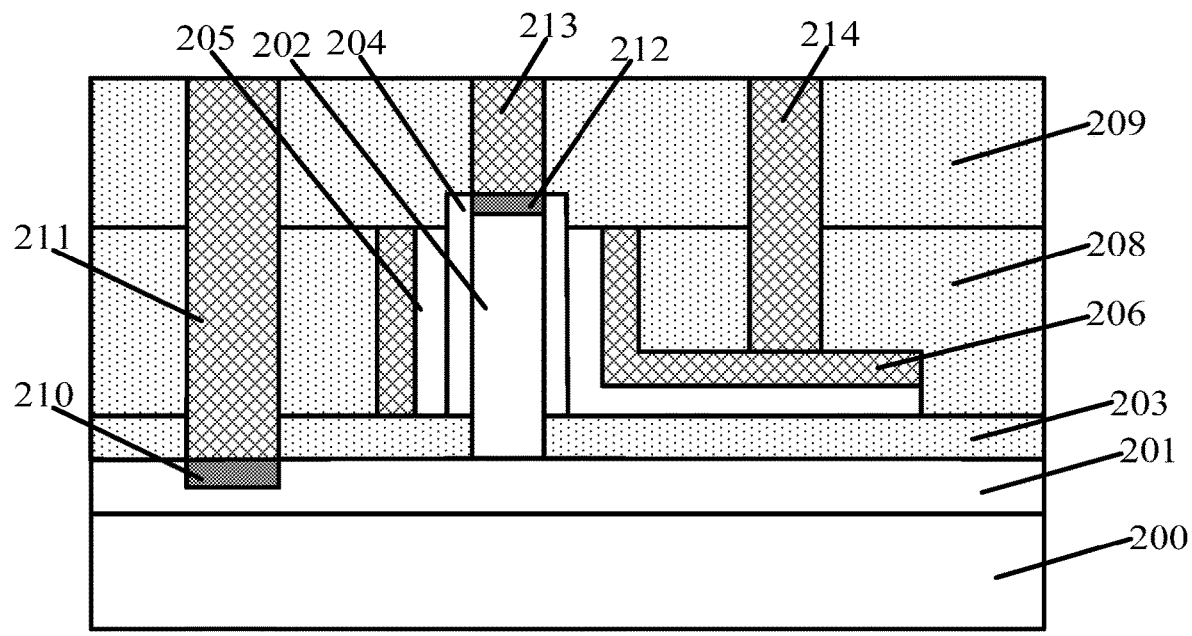
Figure 9:
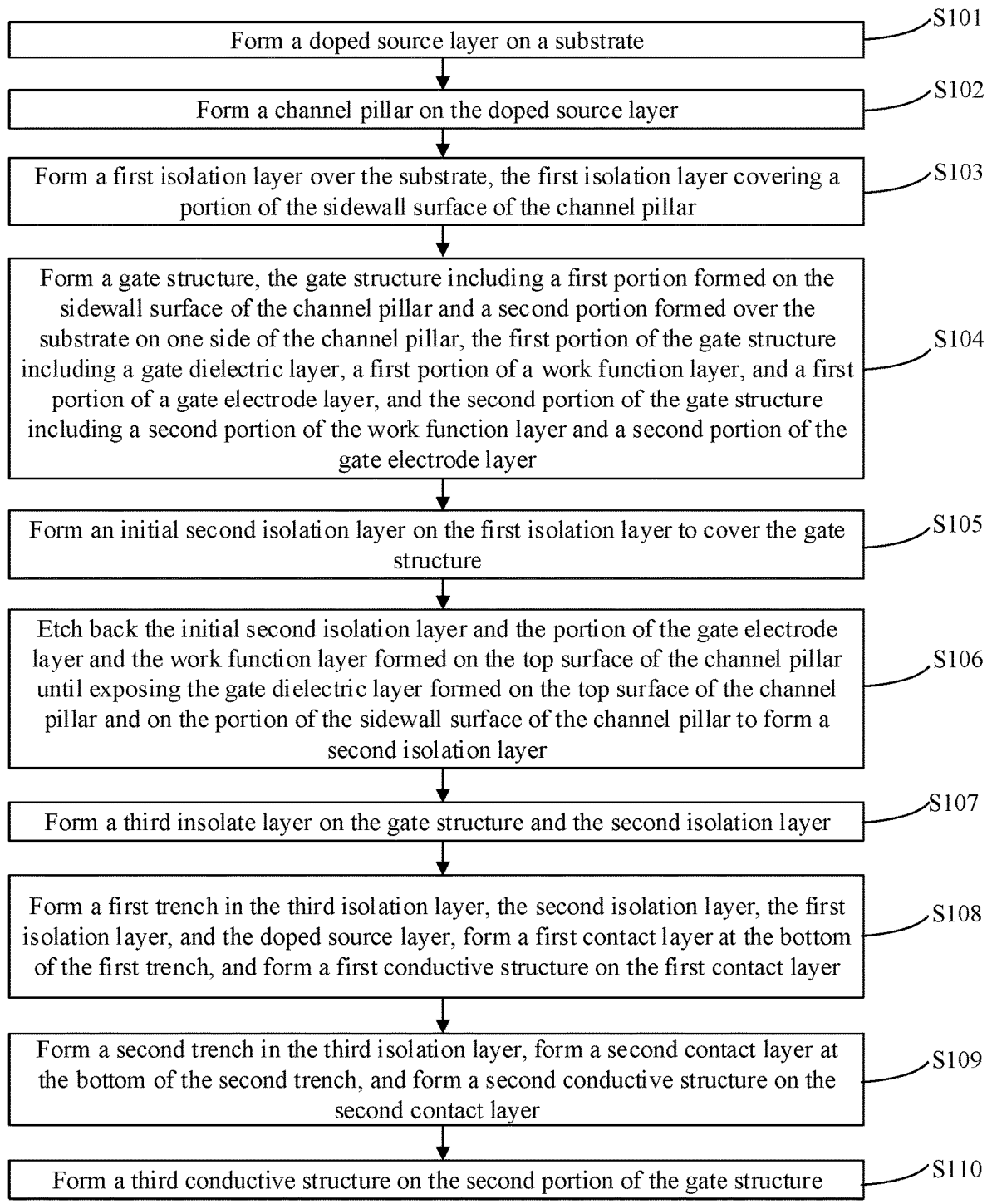
FIG. 9 illustrates a flowchart of an exemplary method for forming a semiconductor structure according to some embodiments of the present disclosure.

The present disclosure provides a method for forming a semiconductor structure. FIG. 9 illustrates a flowchart of an exemplary method for forming a semiconductor structure according to some embodiments of the present disclosure, and FIGS. 2-8 illustrate schematic cross-sectional views of semiconductor structures at certain stages of the exemplary method.

Figure 2:
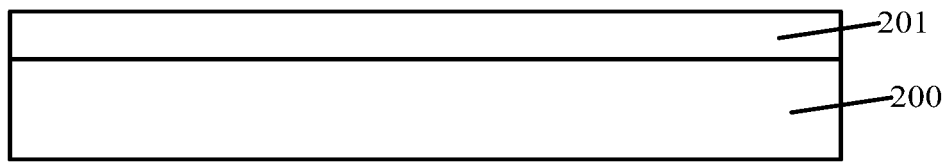
FIG. 2 to FIG. 8 illustrate schematic cross-sectional views of semiconductor structures at certain stages of an exemplary method for fabricating a semiconductor structure according to some embodiments of the present disclosure.

Referring to FIG. 9, in S101, a doped source layer may be formed in a substrate. FIG. 2 illustrates a schematic cross-sectional view of a semiconductor structure according to some embodiments of the present disclosure.

Referring to FIG. 2, a substrate 200 may be provided, and a doped source layer 201 may be formed in the substrate 200. The doped source layer 201 may be the source of the semiconductor structure. In one embodiment, doping ions may be introduced into the doped source layer 201. The doping ions may be N-type doping ions or P-type doping ions. When the doping ions are N-type ions, the doping ions may include phosphorus ions, arsenic ions, or a combination thereof. When the doping ions are P-type ions, the doping ions may include boron ions, indium ions, or a combination thereof.

In one embodiment, forming the doped source layer 201 may include an ion implantation process. For example, an initial doped source layer (not shown) may be formed in the substrate 200, and then the ion implantation process may be performed on the initial doped source layer, such that the doped source layer 201 may be formed from the initial doped source layer. In other embodiments, forming the doped source layer may include an in-situ doping process.

In one embodiment, the substrate 200 may be made of a material including single crystal silicon (Si). In other embodiments, the substrate 200 may be made of a material including polysilicon or non-crystalline silicon. Alternatively, the substrate may be made of a semiconductor material, such as germanium (Ge), silicon-germanium (SiGe), gallium arsenide (GaAs), etc.

Figure 3:
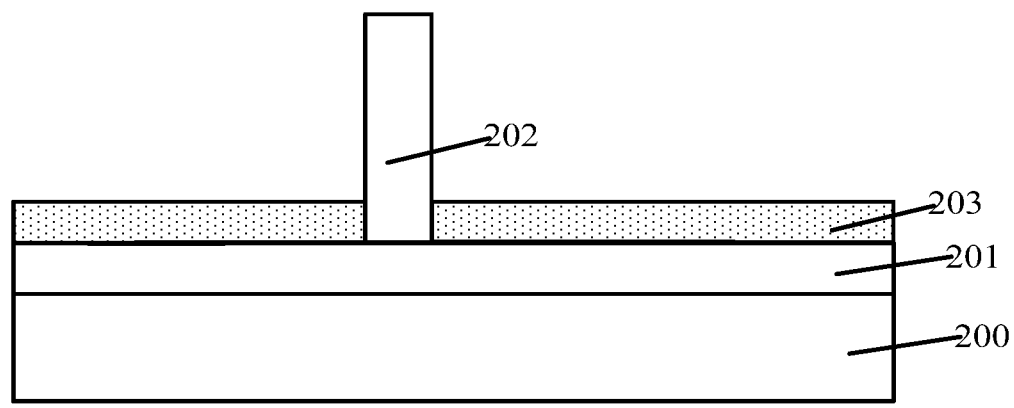

Referring to FIG. 9, in S102, a channel pillar may be formed on the doped source layer. FIG. 3 illustrates a schematic cross-sectional view of a semiconductor structure according to some embodiments of the present disclosure.

Referring to FIG. 3, a channel pillar 202 may be formed on the doped source layer 201. In one embodiment, forming the channel pillar 202 may include the following exemplary steps. A channel material layer (not shown) may be formed over the substrate 200 (e.g. on the doped source layer 201), and then a first mask layer (not shown) may be formed on the surface of the channel material layer. The first mask layer may expose a portion of the surface of the channel material layer. Further, the channel material layer may be etched using the first mask layer as an etch mask until the doped source layer 201 is exposed. As such, the channel pillar 202 may be formed on the doped source layer 201. In one embodiment, etching the channel material layer may include a dry etching process.

In one embodiment, the channel pillar 202 may be made of silicon. In other embodiments, the channel pillar may be made of a semiconductor material such as germanium (Ge), silicon-germanium (SiGe), gallium arsenide (GaAs), etc.

In one embodiment, the channel material layer may be formed by a physical vapor deposition (PVD) process. In other embodiments, the channel material layer may be formed by an epitaxial growth process or an atomic layer deposition (ALD) process.

In one embodiment, the first mask layer may be made of a photoresist. In other embodiments, the first mask layer may be made of a hard mask material, such as silicon oxide ($SiO_x$) or silicon nitride ($SiN_x$).

In one embodiment, the first mask layer may be formed by a spin coating process. Further, after the channel pillar 202 is formed, the first mask layer may be removed. In some embodiments, the first mask layer may be removed by an ashing process.

Returning to FIG. 9, in S103, a first isolation layer may be formed over the substrate, and the first isolation layer may cover a portion of the sidewall surface of the channel pillar. The semiconductor structure shown in FIG. 3 includes an exemplary first isolation layer according to some embodiments of the present disclosure.

Referring to FIG. 3, after the first mask layer is removed, a first isolation layer 203 may be formed over the substrate 200. For example, the first isolation layer 203 may be formed on the doped source layer 201. The first isolation layer 203 may cover a portion of the sidewall surface of the channel pillar 202, and the top surface of the first isolation layer 203 may be lower than the top surface of the channel pillar 202.

In a subsequent process, a first contact layer may be formed in the doped source layer 201, and a first conductive structure may be formed on the first contact layer. The first isolation layer 203 may provide structural support and electrical isolation for the first contact layer and the first conductive structure.

In one embodiment, the first isolation layer 203 may be made of silicon oxide ($SiO_x$). In other embodiments, the first isolation layer may be made of silicon nitride ($SiN_x$) or silicon carbon-nitride (SiCN).

In one embodiment, the first isolation layer 203 may be formed by a chemical vapor deposition (CVD) process. In other embodiments, the first isolation layer may be formed by an ALD process or a thermal oxide process.

Figure 4:
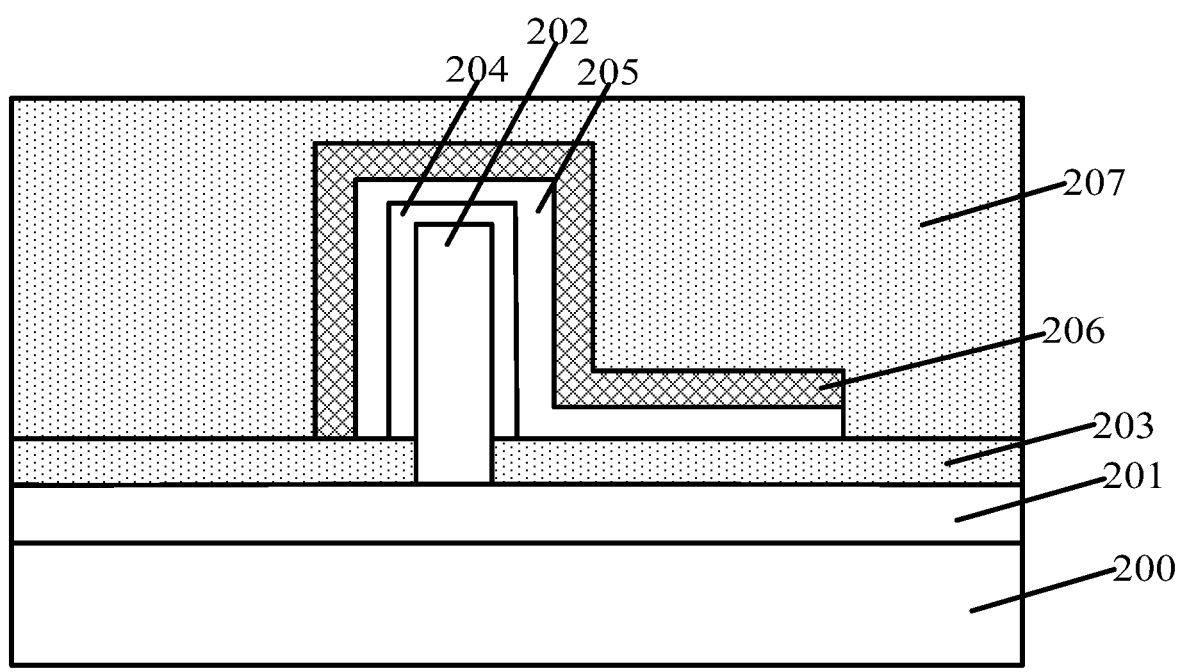

Returning to FIG. 9, in S104, a gate structure may be formed, the gate structure may include a first portion formed on the sidewall surface of the channel pillar and a second portion formed over the substrate on one side of the channel pillar, the first portion of the gate structure may include a gate dielectric layer, a first portion of a work function layer, and a first portion of a gate electrode layer formed on the sidewall surface of the channel pillar, and the second portion of gate structure may include a second portion of the work function layer and a second portion of the gate electrode layer. FIG. 4 illustrates a schematic cross-sectional view of a semiconductor structure according to some embodiments of the present disclosure.

Referring to FIG. 4, a gate structure (not labeled) may be formed on the sidewall surface of the channel pillar 202. The gate structure may include a first portion and a second portion. The first portion (not labeled) may surround the channel pillar 202, and the second portion (not labeled) may be formed over the substrate 200 on one side of the channel pillar 202.

In one embodiment, the gate structure may include a gate dielectric layer 204 formed on the sidewall surface of the channel pillar 202, a work function layer 205 formed on the gate dielectric layer 204 and on a portion of the first isolation layer 203 on one side of the channel pillar 202, and a gate electrode layer 206 formed on the work function layer 205. The first portion of the gate structure may include the gate dielectric layer 204, a first portion of the work function layer 205 formed on the gate dielectric layer 204, and a first portion of the gate electrode layer 206 formed on the first portion of the work function layer 205 that covers the gate dielectric layer 204. The second portion of the gate structure may include a second portion of the work function layer 205 formed on the first isolation layer 203, and a second portion of the gate electrode layer 206 formed on the second portion of the work function layer 205 that covers the first isolation layer 203.

Forming the gate dielectric layer 204 may include the following exemplary steps. A gate dielectric material layer (not shown) may be formed over the substrate 200 and on the sidewall and top surfaces of the channel pillar 202. The gate dielectric material layer may cover the surface of the first isolation layer 203. A second mask layer (not shown) may be formed on the gate dielectric material layer to expose a portion of the gate dielectric material layer, thereby defining a pattern corresponding to the gate dielectric layer 204. Further, the dielectric material layer may be etched using the second mask layer as an etch mask until the surface of the first isolation layer 203 is exposed. As such, the gate dielectric layer 204 may be formed on the sidewall surface of the channel pillar 202.

In one embodiment, the gate dielectric layer 204 may be made of a material with a high relative dielectric constant (e.g., a high-K dielectric material). The relative dielectric constant of the high-K dielectric material is larger than 3.9. The high-K dielectric material may include hafnium oxide ($HfO_x$) or aluminum oxide ($AlO_x$). In other embodiments, the gate dielectric layer may be made of silicon oxide ($SiO_x$).

In one embodiment, the gate dielectric material layer may be formed by a CVD process. In other embodiments, the gate dielectric material layer may be formed by an ALD process.

In one embodiment, the second mask layer may be made of a photoresist. In other embodiments, the second mask layer may be made of a hard mask material, such as silicon oxide ($SiO_x$) or silicon nitride ($SiN_x$).

In one embodiment, the second mask layer may be formed by a spin coating process. Further, after the gate dielectric layer 204 is formed, the second mask layer may be removed. In one embodiment, the second mask layer may be removed by an ashing process.

Forming the work function layer 205 and the gate electrode layer 206 may include the following exemplary steps. A work function material layer (not shown) may be formed over the substrate 200 and the gate dielectric layer 204. In one embodiment, the work functional material layer may cover the first isolation layer 203. Further, a gate material layer (not shown) may be formed on the work function material layer, and a third mask layer (not shown) may be formed on the gate material layer. The third mask layer may expose a portion of the gate material layer and thus define a pattern corresponding to the gate electrode layer 206 and the work function layer 205. Further, the gate material layer and the work function material layer may be etched using the third mask layer as an etch mask until the surface of the first isolation layer 203 is exposed. As such, the work function layer 205 may be formed on the sidewall surface of the channel pillar 202 and the gate electrode layer 206 may be formed on the work function layer 205.

The work function layer 205 may be made of a material including titanium nitride ($TiN_x$), titanium aluminum alloy, or tantalum nitride ($TaN_x$).

The gate electrode layer 206 may be made of polycrystalline silicon or a metal. In one embodiment, the gate electrode layer 206 may be made of a metal. For example, the gate electrode layer 206 may be made of tungsten (W).

In one embodiment, the work function material layer may be formed by a CVD process or a PVD process. In one embodiment, the gate material layer may be formed by a PVD process or an electroplating process. In one embodiment, etching the gate material layer and the work function material layer may include a dry etching process.

In one embodiment, the third mask layer may be made of a photoresist. In other embodiments, the third mask layer may be made of a hard mask material, such as silicon oxide ($SiO_x$) or silicon nitride ($SiN_x$). In one embodiment, the third mask layer may be formed by a spin coating process. Further, after the work function layer 205 and the gate electrode layer 206 is formed, the third mask layer may be removed. In one embodiment, the third mask layer may be removed by an ashing process.

Returning to FIG. 9, in S105, after the gate structure is formed, an initial second isolation layer may be formed on the first isolation layer to cover the gate structure. The semiconductor structure shown in FIG. 4 includes an exemplary initial second isolation layer according to some embodiments of the present disclosure.

Referring to FIG. 4, after the gate structure is formed, an initial second isolation layer 207 may be formed on the surface of the first isolation layer 203. After forming the initial second isolation layer 207, the top and sidewall surfaces of the gate structure may be covered by the initial second isolation layer 207.

In one embodiment, the initial second isolation layer 207 may be made of silicon oxide ($SiO_x$). In other embodiments, the initial second isolation layer 207 may be made of silicon nitride ($SiN_x$) or silicon carbon-nitride (SiCN).

In one embodiment, the initial second isolation layer may be formed by a CVD process. In other embodiments, the initial second isolation layer may be formed by an ALD process or a thermal oxide process.

In a subsequent process, a first contact layer with a first thickness may be formed at the surface of the doped source layer 201, and a second contact layer with a second thickness may be formed on the top surface of the channel pillar 202. Forming the first contact layer and the second contact layer may include the following exemplary steps.

Figure 5:
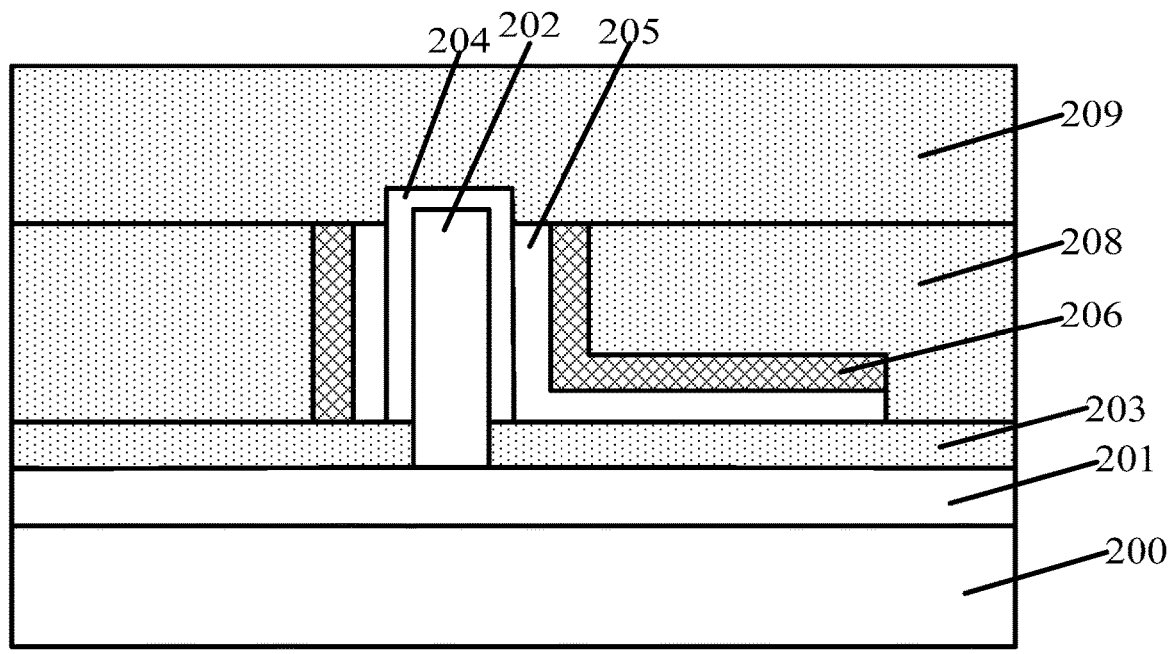

Returning to FIG. 9, in S106, the initial second isolation layer, together with the portion of the gate electrode layer and the work function layer formed on the top surface of the channel pillar, may be etched back to expose the gate dielectric layer formed on the top surface of the channel pillar and the gate dielectric layer formed on an upper portion of the sidewall surface of the channel pillar, and thus form a second isolation layer. FIG. 5 illustrates a schematic cross-sectional view of a semiconductor structure according to some embodiments of the present disclosure.

Referring to FIG. 5, the initial second isolation layer 207 and the portion of the gate electrode layer 206 and the work function layer 205 formed on the top surface of the channel pillar 202 may be etched back to expose the gate dielectric layer 204 formed on the top surface of the channel pillar 202 and on an upper portion of the sidewall surface of the channel pillar 202. As such, the remaining portion of the initial second isolation layer 207 may form a second isolation layer 208.

The initial second isolation layer 207 and the portion of the gate electrode layer 206 and the work function layer 205 formed on the top surface of the channel pillar 202 may be etched back to expose the gate dielectric layer 204 formed on the top surface of the channel pillar 202, such that after forming a third isolation layer in a subsequent process, when a second contact layer is further formed on the top surface of the channel pillar 202 and a second conductive structure is formed on the surface of the second contact layer, the gate dielectric layer 204 formed on the top of the channel pillar 202 can be quickly removed. As such, the process of etching the gate electrode layer 206 and the work function layer 205 may be saved, thereby simplifying the fabrication process.

The etch gas used for etching back the initial second isolation layer 207 and the portion of the gate electrode layer 206 and the work function layer 205 formed on the top surface of the channel pillar 202 may have a high etching selection ratio on the initial second isolation layer 207, the gate electrode layer 206, and the work function layer 205 as compared to the gate dielectric layer 204. Therefore, when the initial second isolation layer 207, the gate electrode layer 206, and the work function layer 205 are etched, the gate dielectric layer 204 may be slightly etched, such that damage to the channel pillar 202 may be avoided.

The second isolation layer 208 and the first isolation layer 203 may together provide structural support and electrical isolation for a first contact layer that is subsequently formed in the doped source layer 201 and a first conductive layer that is formed on the first contact layer, and also for a third conductive structure that is formed on the surface of the second portion of the gate structure.

Returning to FIG. 9, in S107, after the second isolation layer is formed, a third isolation layer may be formed on the gate structure and the second isolation layer. The semiconductor structure shown in FIG. 5 includes an exemplary third isolation layer according to some embodiments of the present disclosure.

Referring to FIG. 5, after forming the second isolation layer 208, a third isolation layer 209 may be formed on the gate structure and the second isolation layer 208.

The third isolation layer 209, the second isolation layer 208, and the first isolation layer 203 may together provide structural support and electrical isolation for a first contact layer that is subsequently formed in the doped source layer 201 and a first conductive layer that is formed on the first contact layer, for a third conductive structure that is formed on the surface of the second portion of the gate structure, and also for a second contact layer that is subsequently formed on the top surface of the channel pillar 202 and a second conductive structure formed on the surface of the second contact layer.

The top surface of the third isolation layer 209 may be higher than the top surface of the gate structure. In one embodiment, the third isolation layer 209 may be made of silicon oxide ($SiO_x$). In other embodiments, the third isolation layer may be made of silicon nitride ($SiN_x$) or silicon carbon-nitride (SiCN).

In one embodiment, the third isolation layer 209 may be formed by a CVD process. In other embodiments, the third isolation layer may be formed by an ALD process or a thermal oxide process.

Figure 6:
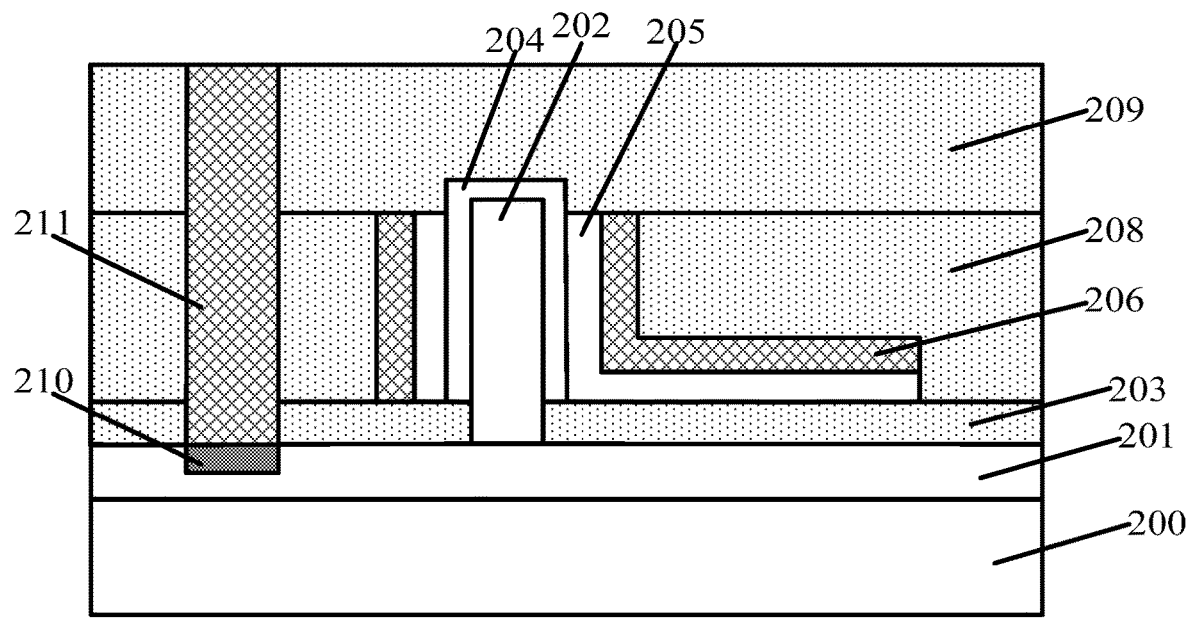

Returning to FIG. 9, in S108, a first trench may be formed in the third isolation layer, the second isolation layer, the first isolation layer, and the doped source layer, a first contact layer may be formed at the bottom of the first trench, and a first conductive structure may be formed over the first contact layer. FIG. 6 illustrates a schematic cross-sectional view of a semiconductor structure according to some embodiments of the present disclosure.

Referring to FIG. 6, a first trench (not shown) may be formed in the third isolation layer 209, the second isolation layer 208, the first isolation layer 203, and the doped source layer 201. Further, a first contact layer 210 may be formed at the bottom of the first trench, and a first conductive structure 211 may be formed on the surface of the first contact layer 210.

Forming the first trench may include the following exemplary steps. A fourth mask layer may be formed on the third isolation layer 209. The fourth mask layer may expose a portion of the third isolation layer 209, and thus define a pattern corresponding to the location of the first trench. Further, the third isolation layer 209, the second isolation layer 208, the first isolation layer 203, and the doped source layer 201 may be etched using the fourth mask layer as an etch mask to form the first trench. Therefore, the first trench may be formed in the third isolation layer 209, the second isolation layer 208, the first isolation layer 203, and the doped source layer 201.

In one embodiment, the third isolation layer 209, the second isolation layer 208, the first isolation layer 203, and the doped source layer 201 may be etched by a dry etching process.

Forming the first contact layer 210 and the first conductive structure 211 may include the following exemplary steps. A first contact material layer (not shown) may be formed on the bottom of the first trench. The first contact material layer may also cover the third isolation layer 209. A first conductive material layer (not shown) may then be formed on the first contact material layer to fully fill the first trench. The first conductive material layer and the first contact material layer may be planarized until the third isolation layer 209 is exposed. As such, an initial first contact layer (not shown) may be formed in the first trench, and an initial first conductive structure (not shown) may be formed on the initial first contact layer. Further, a first annealing treatment process may be performed on the initial first contact layer and the initial first conductive structure to form the first contact layer 210 and the first conductive structure 211.

The first contact material layer may be made of a metal, including titanium (Ti), nickel (Ni), cobalt (Co), or a combination thereof. The first contact layer 210 may be made of a metal silicide, such as titanium silicide, nickel silicide, cobalt silicide, or a combination thereof.

During the first annealing treatment process, the initial first contact layer may react with the doped source layer 201 to form the first contact layer 210.

The first contact layer may be formed by a PVD process, an electroplating process, or an ALD process. In one embodiment, the first contact material layer may be formed by an ALD process. The ALD process may be able to form a first contact material layer with a dense structure and an accurate thickness.

The thickness of the first contact layer 201 may be a first thickness, and the thickness of the second contact layer may be a second thickness. In one embodiment, the first thickness of the first contact layer 210 may be greater than the second thickness of a subsequently formed second contact layer. Since the thickness of the first contact layer 210 is large, the contact resistance at the first contact layer 210 may be small. Therefore, the current flowing through the circuit may be large, which is conducive to improving the device performance of the semiconductor structure.

The thickness of the first contact layer 210 may not be too large or too small. When the thickness of the first contact layer 210 is too large, the initial first contact layer, which forms the first contact layer 210, may not be able to fully react with the doped source layer 201 to form the metal silicide when the annealing treatment process is performed. Therefore, the contact resistance at the first contact layer 210 is relatively large, and the contact resistance between the first conductive structure 211 and the doped source layer 201 may not be reduced. However, when the thickness of the first contact layer 210 is too small, after performing the annealing treatment process, the contact resistance may not be significantly reduced. Therefore, in one embodiment, the first thickness may be in a range of approximately 5 nm to 10 nm.

The first conductive structure 211 may be made of a metal, such as copper (Cu), tungsten (W), aluminum (Al), or a combination thereof. The first conductive structure 211 may be formed by a PVD process or an electroplating process.

In one embodiment, the processing temperature used in the first annealing treatment process may be in a range of approximately 400° C. to 700° C. In one embodiment, the first conductive material layer and the first contact material layer may be planarized by a chemical mechanical polishing (CMP) process.

Returning to FIG. 9, in S109, a second trench may be formed in the third isolation layer, a second contact layer may be formed at the bottom of the second trench, and a second conductive structure may be formed on the second contact layer. FIG. 7 illustrates a schematic cross-sectional view of a semiconductor structure according to some embodiments of the present disclosure.

Referring to FIG. 7, a second trench (not shown) may be formed in the third isolation layer 209. Further, a second contact layer 212 may be formed at the bottom of the second trench, and a second conductive structure 213 may be formed on the surface of the second contact layer 212.

Forming the second trench may include the following exemplary steps. A fifth mask layer (not shown) may be formed on the third isolation layer 209. The fifth mask layer may expose a portion of the third isolation layer 209 and thus define a pattern corresponding to the second trench. The third isolation layer 209 and the portion of the gate dielectric layer 204 formed on the top surface of the channel pillar 202 may be etched using the fifth mask layer as an etch mask until the top surface of channel pillar 202 is exposed. As such, the second trench may be formed in the third isolation layer 209. In one embodiment, the third isolation layer 209 and the portion of the gate dielectric layer 204 formed on the top surface of channel pillar 202 may be etched by a dry etching process.

Forming the second contact layer 212 and the second conductive structure 213 may include the following exemplary steps. A second contact material layer (not shown) may be formed at the bottom of the second trench. The second contact material layer may also cover the third isolation layer 209. A second conductive material layer (not shown) may be formed on the second contact material layer. The second conductive material layer may fully fill the second trench. Further, the second conductive material layer and the second contact material layer may be planarized until the surface of the third isolation layer 209 is exposed. As such, an initial second contact layer (not shown) may be formed in the second trench and an initial second conductive structure (not shown) may be formed on the initial second contact layer. Then, a second annealing treatment process may be performed on the initial second contact layer and the initial second conductive structure to form the second contact layer 212 and the second conductive structure 211.

The second contact material layer may be made of a metal, such as titanium (Ti), nickel (Ni), cobalt (Co), or a combination thereof. The second contact layer 212 may be made of a metal silicide, such as titanium silicide, nickel silicide, cobalt silicide, or a combination thereof.

During the second annealing treatment process, the initial second contact layer may react with the doped source layer 201 to form the second contact layer 212.

The second contact layer may be formed by a PVD process, an electroplating process, or an ALD process. In one embodiment, the second contact material layer may be formed by an ALD process. The ALD process may be able to form a second contact material layer with a dense structure and an accurate thickness.

The first contact layer 210 may have a first thickness, and the second contact layer 212 may have a second thickness. In one embodiment, the second thickness of the second contact layer 212 may be smaller than the first thickness of the first contact layer 210. When the thickness of the second contact layer 212 is small, at the position where the formed second conductive structure 213 contacts the second contact layer 212, the current leakage caused by the metal ions in the second contact layer 212 diffusing into the channel pillar 202 is reduced. Therefore, the device performance of the semiconductor structure may be improved.

The thickness of the second contact layer 212 may not be too large or too small. For example, when the thickness of the second contact layer 212 is too large, the metal ions in the initial second contact layer may be easily diffused into the channel pillar 202, such that current leakage may occur at the position where the second conductive structure 213 contacts the second contact layer 212. As such, the device performance of semiconductor structure may be degraded. However, when the thickness of the second contact layer 212 is too small, the contact resistance may be large, and thus may not be conducive to improving the device performance of the semiconductor structure. Therefore, in one embodiment, the second thickness may be in a range of approximately 3 nm to 6 nm.

The second conductive structure 213 may be made of a metal, such as copper (Cu), tungsten (W), aluminum (Al), or a combination thereof. The second conductive structure 213 may be formed by a PVD process or an electroplating process.

In one embodiment, the processing temperature for the second annealing treatment process may be in a range of approximately 400° C. to 700° C. In some embodiments, the first annealing treatment process and the second annealing treatment process may be performed simultaneously. That is, the first annealing treatment process and the second annealing treatment process may be a same annealing treatment process.

In one embodiment, the second conductive material layer and the second contact material layer may be planarized by a CMP process.

Returning to FIG. 9, in S110, a third conductive structure may be formed on the second portion of the gate structure. FIG. 8 illustrates a schematic cross-sectional view of a semiconductor structure according to some embodiments of the present disclosure.

Referring to FIG. 8, a third conductive structure 214 may be formed on the second portion of the gate structure. In one embodiment, forming the second conductive structure 214 may include the following exemplary steps. A sixth mask layer (not shown) may be formed on the third isolation layer 209. The sixth mask layer may expose a portion of the third isolation layer 209, and thus define a pattern corresponding to the position of the third conductive structure 214. Then, the third isolation layer 209 and the second isolation layer 208 may be etched using the sixth mask layer as an etch mask until the second portion of the gate electrode layer 206 is exposed. As such, a third trench may be formed in the third isolation layer 209 and the second isolation layer 208. A third conductive material layer (not shown) may be formed in the third trench. The third conductive material layer may also cover the third isolation layer 209. Further, the third conductive material layer may be planarized until the surface of the third isolation layer 209 is exposed. As such, the third conductive structure 214 may be formed.

The third conductive structure 214 may be made of a metal, such as copper (Cu), tungsten (W), aluminum (Al), or a combination thereof. The third conductive structure 214 may be formed by a PVD process or an electroplating process.

In one embodiment, the third isolation layer 209 and the second isolation layer 208 may be etched by a dry etching process. In one embodiment, the second conductive material layer may be planarized by a CMP process.

According to the method described above, a semiconductor structure may thus be formed. In the semiconductor structure, the first contact layer formed over the doped source layer has a first thickness, the second contact layer formed on the top surface of the channel pillar has a second thickness, and the first thickness is greater than the second thickness. Therefore, the semiconductor structure satisfies the requirement that the contact layer has different thicknesses at different positions, thereby improving the device performance of the semiconductor structure.

Correspondingly, the present disclosure also provides a semiconductor structure. FIG. 8 illustrates a schematic cross-sectional view of an exemplary semiconductor structure according to some embodiments of the present disclosure.

Referring to FIG. 8, the semiconductor structure may include a doped source layer 201 formed in a substrate 200, a channel pillar 202 formed on the doped source layer 201, a gate structure formed on the sidewall surface of the channel pillar 202, a first contact layer 210 formed on the doped source layer 201, and a second contact layer 212 formed on the top surface of the channel pillar 202. The first contact layer 210 may have a first thickness, the second contact layer 212 may have a second thickness, and the first thickness may be greater than the second thickness.

In one embodiment, the first thickness may be in a range of approximately 5 nm to 10 nm, and the second thickness may be in a range of approximately 3 nm to 6 nm.

The first contact layer may be made of a metal silicide, such as titanium silicide, nickel silicide, cobalt silicide, or a combination thereof. The second contact layer may be made of a metal silicide, such as titanium silicide, nickel silicide, cobalt silicide, or a combination thereof.

The semiconductor structure may further include a first conductive structure 211 formed on the first contact layer 210, and a second conductive structure 213 formed on the second contact layer 212.

In one embodiment, the first conductive structure 211 may be made of a metal, such as copper (Cu), tungsten (W), aluminum (Al), or a combination thereof. The second conductive structure 212 may be made of a metal, such as copper (Cu), tungsten (W), aluminum (Al), or a combination thereof.

The gate structure may include a first portion and a second portion. The first portion may surround the channel pillar 202, and the second portion may be formed over the substrate 200 on one side of the channel pillar 202. In one embodiment, the gate structure may include a gate dielectric layer 204 formed on the sidewall surface of the channel pillar 202, a work function layer 205 formed on the gate dielectric layer 204 and on a portion of the first isolation layer 203 on one side of the channel pillar 202, and a gate electrode layer 206 formed on the work function layer 205. The first portion of the gate structure may include the gate dielectric layer 204, a first portion of the work function layer 205 formed on the gate dielectric layer 204, and a first portion of the gate electrode layer 206 formed on the first portion of the work function layer 205 that covers the gate dielectric layer 204. The second portion of the gate structure may include a second portion of the work function layer 205 formed on the first isolation layer 203, and a second portion of the gate electrode layer 206 formed on the second portion of the work function layer 205 that covers the first isolation layer 203.

The semiconductor structure may further include a third conductive structure 214 formed on the second portion of the gate structure, a first isolation layer 203 disposed between the gate structure and the substrate 200, a second isolation layer 208 formed on the first isolation layer 203, a third isolation layer 209 formed above the gate structure and the second isolation layer 208. The gate structure may be located in the second isolation layer 208.

Compared to existing semiconductor structures and fabrication methods, the disclosed semiconductor structures and fabrication methods may demonstrate the following exemplary advantages.

According to the disclosed semiconductor structures, the first contact layer has a first thickness, the second contact layer has a second thickness, and the first thickness is greater than the second thickness. When the thickness of the first contact layer is large, the contact resistance at the first contact layer may be small. Therefore, the current flowing through the circuit may be large, which is conducive to improving the device performance of the semiconductor structure. When the thickness of the second contact layer is small, at the position where the subsequently formed conductive structure contacts the second contact layer, the current leakage caused by the metal ions in the second contact layer diffusing into the channel pillar is reduced. Therefore, the device performance of the semiconductor structure may be improved.

According to the disclosed fabrication methods, the first contact layer formed at the surface of the doped source layer has a first thickness, and the second contact layer formed on the top surface of the channel pillar has a second thickness. The process of forming the first contact layer is different from the process of forming the second contact layer, such that the first contact layer and the second contact layer may have different thicknesses. As such, the requirement that the contact layer has different thicknesses at different positions may be satisfied, and thus the device performance of the semiconductor structure may be improved.

Although the present disclosure is disclosed as above, but the present disclosure is not limited to above-described embodiments. Any skilled in the art may make various modifications and changes without departing from the spirit and scope of the present disclosure. Therefore, the scope of the present invention shall be subject to the scope defined by the claims.

What is claimed is:

1. A semiconductor structure, comprising:
a substrate;
a doped source layer, formed in the substrate;
a channel pillar, formed on the doped source layer;
a gate structure, formed on a sidewall surface of the channel pillar;
a first contact layer, having a top surface coplanar with a top surface of the doped source layer and a first thickness and formed at a surface of the doped source layer;
a first conductive structure, formed on the first contact layer;
a second contact layer, having a top surface coplanar with a top surface of the gate structure and a second thickness and formed on a top surface of the channel pillar, wherein the first thickness is greater than the second thickness; and
a second conductive structure, formed on the second contact layer, wherein an interface plane between the second contact layer and the second conductive structure is coplanar with the top surface of the gate structure.

2. The semiconductor structure according to claim 1, wherein:
the first thickness is in a range of approximately 5 nm to 10 nm.

3. The semiconductor structure according to claim 1, wherein:
the second thickness is in a range of approximately 3 nm to 6 nm.

4. The semiconductor structure according to claim 1, wherein:
the first contact layer is made of a metal silicide, the metal silicide including titanium silicide, nickel silicide, cobalt silicide, or a combination thereof; and
the second contact layer is made of a metal silicide, the metal silicide including titanium silicide, nickel silicide, cobalt silicide, or a combination thereof.

5. The semiconductor structure according to claim 1, wherein:
the first conductive structure is made of a metal, the metal including copper (Cu), tungsten (W), aluminum (Al), or a combination thereof; and
the second conductive structure is made of a metal, the metal including copper (Cu), tungsten (W), aluminum (Al), or a combination thereof.

6. The semiconductor structure according to claim 1, wherein the gate structure includes:
a first portion and a second portion, wherein:
the first portion surrounds the channel pillar and has a top surface coplanar with the top surface of the second contact layer, and
the second portion is formed over the substrate on one side of the channel pillar and has a top surface lower than with a top surface of the channel pillar.

7. The semiconductor structure according to claim 6, wherein:
the first portion of the gate structure includes:
a gate dielectric layer symmetrically formed on the sidewall surface of the channel pillar,
a first portion of a work function layer formed on the gate dielectric layer, and
a first portion of a gate electrode layer formed on the first portion of the work function layer; and
the second portion of the gate structure includes:
a second portion of the work function layer formed over the substrate, and
a second portion of the gate electrode layer formed over the second portion of the work function layer.

8. The semiconductor structure according to claim 7, wherein:
the gate dielectric layer is made of a material having a dielectric constant greater than 3.9;
the work function layer is made of a material including titanium nitride ($TiN_x$), titanium aluminum alloy, or tantalum nitride ($TaN_x$); and
the gate electrode layer is made of polycrystalline silicon or a metal, wherein the metal includes tungsten (W).

9. The semiconductor structure according to claim 6, further including:
a third conductive structure, formed on the second portion of the gate structure.

10. The semiconductor structure according to claim 1, further including:
a first isolation layer, disposed between the gate structure and the substrate; and a second isolation layer, formed on the first isolation layer, wherein:
  the gate structure is located in the second isolation layer.

11. The semiconductor structure according to claim 10, further including:
  a third isolation layer, formed on the gate structure and on the second isolation layer.

12. The semiconductor structure according to claim 10, wherein:
  the second isolation layer has a top surface lower than the top surface of the gate structure.

13. The semiconductor structure according to claim 10, wherein:
  the gate structure includes a gate dielectric layer formed on the sidewall surface of the channel pillar, a work function layer formed on the gate dielectric layer, and a gate electrode layer formed on the work function layer, wherein the top surface of the gate structure is coplanar with a top surface of the gate dielectric layer and higher than a top surface of the gate electrode layer.

\* \* \* \* \*